United States Patent [19]
Shinozaki

[11] Patent Number: 5,854,765
[45] Date of Patent: Dec. 29, 1998

[54] SEMICONDUCTOR MEMORY DEVICE

[75] Inventor: Naoharu Shinozaki, Kawasaki, Japan

[73] Assignee: Fujitsu Limited, Kanagawa, Japan

[21] Appl. No.: 845,031

[22] Filed: Apr. 21, 1997

Related U.S. Application Data

[63] Continuation of Ser. No. 587,749, Jan. 17, 1996, abandoned.

[30] Foreign Application Priority Data

Aug. 17, 1995 [JP] Japan ................................ 7-209390

[51] Int. Cl.⁶ .................................................. G11C 7/00
[52] U.S. Cl. ...................... 365/201; 365/189.11; 365/191
[58] Field of Search .............................. 365/201, 189.05, 365/189.11, 191

[56] References Cited

U.S. PATENT DOCUMENTS

| | | | |
|---|---|---|---|
| 5,444,661 | 8/1995 | Matsui | 365/201 |
| 5,469,394 | 11/1995 | Kumakura et al. | 365/207 |
| 5,500,824 | 3/1996 | Fink | 365/201 |

FOREIGN PATENT DOCUMENTS 0 440 206 A2  8/1991  European Pat. Off. .

*Primary Examiner*—Do Hyun Yoo
*Attorney, Agent, or Firm*—Nikaido, Marmelstein, Murray & Oram, LLP

[57] ABSTRACT

A semiconductor memory device includes a memory cell portion and at least one output part being provided with a plurality of read data which are read from the memory cell portion and a mode selection signal. The output part has a logic decision circuit for producing a control signal indicating whether logic levels of the plurality of read data are all the same, and an output circuit controlling to operate in at least one of two states, a first state being to transmit first read data of the plurality of read data to an output port of the output circuit and a second state being to set the output port to be at a high-impedance state depending on the control signal and the mode selection signal. In the output part, when the mode selection signal indicates a normal mode, the output circuit operates in said first state, and when the mode selection signal indicates a test mode, the output circuit operates in one of said first state and said second state depending on the control signal.

8 Claims, 9 Drawing Sheets

(DQ0Z~DQ3Z=ALL H)

(DQ0Z~DQ3Z=ALL L)

LOGIC DECISION CIRCUIT

OUTPUT CIRCUIT (DQ0Z~DQ3Z ≠ ALL H OR ALL L)

(HIZ=H, DQ0Z=L)

(HIZ=L)

SEMICONDUCTOR MEMORY DEVICE

This application is a continuation of application Ser. No. 08/587,749 filed Jan. 17,1996, now abandoned

BACKGROUND OF THE INVENTION

1. Field of the Invention

The present invention generally relates to a semiconductor memory device, and more particularly, to a semiconductor memory device in which read data having a plurality of bits, read in parallel from an internal memory cell portion, is compressed and produced into fewer bits to be tested for reducing the time for testing a storage function of the semiconductor memory device.

2. Description of the Related Art

FIG. 1 shows a block diagram of a conventional semiconductor memory device having a datacompression test mode. The semiconductor memory device shown in FIG. 1 may be one of a variety of memories. In FIG. 1, the semiconductor memory device having 4-bit outputs is shown, and for one of the outputs, an output part for enabling the data-compression test mode is provided.

In another semiconductor memory device having no data-compression test mode, when read data having a plurality of bits is output in parallel from the device, these bits are tested in series. On the other hand, in the semiconductor memory device shown in FIG. 1, when 4-bit read data is output in parallel from a memory cell portion, in the output part, the 4-bit read data is compressed into 1-bit data. Therefore, for the 4-bit read data, only the 1-bit data is tested by the following method.

For the data-compression test mode, a "01Z-test mode" is known. In the 01Z-test mode, the read data of a plurality of bits is compressed and produced into 1-bit data.

Further, in the 01Z-test mode, when all bits in the read data are at a logic-high level (referred to as "an H level", hereinafter), the output part produces 1-bit data of an H level, when the all bits are at a logic-low level (referred to as "an L level", hereinafter), the output part produces 1-bit data of an L level, and when the all of the bits are at not either an H level or an L level, the output of the output part is set to a high-impedance state.

FIG. 2 shows a schematic diagram of a prior-art output part of the conventional semiconductor memory device shown in FIG. 1. The output part shown in FIG. 2 can perform the above-mentioned 01Z-test mode.

In FIG. 2, symbols "DQ0Z–DQ3Z" are the read data which have been read in parallel from the memory cell portion (cell array part), and a symbol "TESTZ" is a 01Z-test-mode setting signal for setting the 01Z-test mode. The 01Z-test-mode setting signal TESTZ is set to an H level for the 01Z-test mode, and is set to an L level for a normal mode in that the read data is directly produced without compression.

A symbol "HIZ" indicates a high-impedance setting signal for setting the output of the output part to the high-impedance state. The high-impedance setting signal HIZ is set to an H level for setting the output of the output part to the high-impedance state.

The output part shown in FIG. 2 comprises an output circuit 1 and an output circuit 16 having a portion of the output circuit 1. The output circuit 1 is provided for the read data DQ0Z to perform the normal mode. The output circuit 1 includes a pad 2 of a data input-and-output port.

The output circuit 1 includes a pMOS transistor 3 provided as an output transistor for a pull-up operation, an nMOS transistor 4 provided as an output transistor for a pull-down operation, a NAND circuit 5 driving the pMOS transistor 3, and a NOR circuit 6 driving the nMOS transistor 4.

The output circuit 1 further includes an inverter 7 inverting the read data DQ0Z, an inverter 8 inverting the 01Z-test-mode setting signal TESTZ, and an inverter 9 inverting the high-impedance setting signal HIZ.

In the output circuit 1, a NAND circuit 10 NAND processes an output of the inverter 7 and an output of the inverter 8, a NOR circuit 11 NOR processes the 01Z-test-mode setting signal TESTZ and the output of the inverter 7.

In the output circuit 1, a pMOS transistor 12 is connected between a VCC power-supply line for supplying a power-supply voltage VCC and a power-supply port of the NAND circuit 10, and is controlled to be conductive (referred to as "ON" or "an ON state", hereinafter) and non-conductive (referred to as "OFF" or "an OFF state", hereinafter) by the high-impedance setting signal HIZ.

An nMOS transistor 13 is connected between a ground port of the NOR circuit 11 and a ground line, and is controlled to be ON and OFF by the output of the inverter 9.

An nMOS transistor 14 is connected between an output port of the NAND circuit 10 and the ground line, and is controlled to be ON and OFF by the high-impedance setting signal HIZ.

A pMOS transistor 15 is connected between the VCC power-supply line and an output port of the NOR circuit 11, and is controlled to be ON and OFF by the output of the inverter 9.

The output circuit 16 is provided for the read data DQ0Z to DQ3Z to perform the 01Z-test mode. The output circuit 16 also includes the pMOS transistor 3, the nMOS transistor 4, the NAND circuit 5 and the NOR circuit 6 which are included in the output circuit 1.

The output circuit 16 further includes a NAND circuit 17 for NAND processing the read data DQ0Z to DQ3Z, and a NOR circuit 18 for NOR processing the read data DQ0Z to DQ3Z.

The output circuit 16 still further includes a NAND circuit 19 for NAND processing an output of the NAND circuit 17 and an output of the NOR circuit 18, and a NOR circuit 20 for NOR processing the output of the NAND circuit 17 and the output of the NOR circuit 18.

In the output circuit 16, an inverter 21 inverts the 01Z-test-mode setting signal TESTZ, a pMOS transistor 22 is connected between the VCC power-supply line and a power-supply port of the NAND circuit 19, and is controlled to be ON and OFF by an output of the inverter 21.

An nMOS transistor 23 is connected between a ground port of the NOR circuit 20 and the ground line, and is controlled to be ON and OFF by the 01Z-test-mode setting signal TESTZ.

An nMOS transistor 24 is connected between an output port of the NAND circuit 19 and the ground line, and is controlled to be ON and OFF by an output of the inverter 21.

A pMOS transistor 25 is connected between the VCC power-supply line and an output port of the NOR circuit 20, and is controlled to be ON and OFF by the 01Z-test-mode setting signal TESTZ.

In the semiconductor memory device, in the 01Z-test mode, the 01Z-test-mode setting signal TESTZ is set to an H level, and the high-impedance setting signal HIZ is set to an L level.

As a result, in the output circuit 1, the pMOS transistor 12 switches to an ON state, the NAND circuit 10 is activated, and nMOS transistor 14 switches to an OFF state.

At that time, the output of the inverter 9 switches to an H level, the nMOS transistor 13 is controlled to be ON, the NOR circuit 11 is activated, and the pMOS transistor 15 is controlled to be OFF.

At the same time, the output of the inverter 8 switches to an L level, the output of the NAND circuit 10 switches to an H level, whereby the NAND circuit 5 is controlled to operate as an inverter for the output of the NOR circuit 20. Further, the output of the NOR circuit 11 switches to an L level, whereby the NOR circuit 6 is controlled to operate an inverter for the output of the NAND circuit 19.

In the output circuit 16, the output of the inverter 21 switches to an L level, the pMOS transistor 22 is controlled to be ON, whereby the NAND circuit 19 is activated and the nMOS transistor 24 switches to an OFF state.

At that time, the nMOS transistor 23 switches to an ON state, whereby the NOR circuit 20 is activated and the pMOS transistor 25 switches to an OFF state.

In the above-discussed case, when the bits of the read data DQ0Z to DQ3Z are all H level, the output of the NAND circuit 17 is at an L level, the output of the NOR circuit 18 is at an L level, the output of the NAND circuit 19 is at an H level, and the output of the NOR circuit 20 is at an H level.

As a result, the output of the NAND circuit 5 becomes an L level and the output of the NOR circuit 6 becomes an L level, whereby the pMOS transistor 3 becomes an ON state and the nMOS transistor 4 becomes an OFF state. Accordingly, the data DQ0 produced in the pad 2 becomes an H level.

On the other hand, when the bits of the read data DQ0Z to DQ3Z are all L level, the output of the NAND circuit 17 becomes an H level, the output of the NOR circuit 18 becomes an H level, the output of the NAND circuit 19 becomes an L level, and the output of the NOR circuit 20 becomes an L level.

As a result, the output of the NAND circuit 5 becomes an H level and the output of the NOR circuit 6 becomes an H level, whereby the pMOS transistor 3 becomes an OFF state and the nMOS transistor 4 becomes an ON state. Accordingly, the data DQ0 produced in the pad 2 becomes an L level.

When the bits of the read data DQ0Z to DQ3Z are not either all H level or all L level, the output of the NAND circuit 17 becomes an H level, the output of the NOR circuit 18 becomes an L level, the output of the NAND circuit 19 becomes an H level, and the output of the NOR circuit 20 becomes an L level.

As a result, the output of the NAND circuit 5 becomes an H level and the output of the NOR circuit 6 becomes an L level, whereby the pMOS transistor 3 becomes an OFF state and the nMOS transistor 4 becomes an OFF state. Accordingly, the output state in the pad 2 becomes a high-impedance state.

In the normal mode, the 01Z-test-mode setting signal TESTZ is set to an L level.

As a result, in the output circuit 16, the output of the inverter 21 becomes an H level and the pMOS transistor 22 becomes an OFF state, whereby the NAND circuit 19 is deactivated, the nMOS transistor 24 becomes an ON state, and a level of a node 24A becomes an L level.

At that time, nMOS transistor 23 becomes an OFF state, whereby the NOR circuit 20 is deactivated, pMOS transistor 25 becomes an ON state, and a level of a node 25A becomes an H level.

As a result, the NAND circuit 5 is controlled to operate as an inverter for the output of the NAND circuit 10, and the NOR circuit 6 is controlled to operate as an inverter for the output of the NOR circuit 11.

In the above-discussed case, when the high-impedance setting signal HIZ is set to an L level, the pMOS transistor 12 becomes an ON state, whereby the NAND circuit 10 is activated and the nMOS transistor 14 becomes an OFF state.

At that time, the output of the inverter 9 becomes an H level and the nMOS transistor 13 becomes an ON state, whereby the NOR circuit 11 is activated and the pMOS transistor 15 becomes an OFF state.

As mentioned before, when the 01Z-test-mode setting signal TESTZ is set to an L level, the output of the inverter 8 becomes an H level, whereby the NAND circuit 10 is controlled to operate as an inverter for the output of the inverter, and the NOR circuit 11 is controlled to operate as an inverter for the output of the inverter 7.

In this case, when the read data DQ0Z is an H level, the output of the inverter 7 becomes an L level, the output of the NAND circuit 10 becomes an H level, and the output of the NOR circuit 11 becomes an H level.

As a result, the output of the NAND circuit 5 becomes an L level, whereby the pMOS transistor 3 becomes an ON state, and the output of the NOR circuit 6 becomes an L level, whereby the nMOS transistor 4 becomes an OFF state, and, thus, the data DQ0 produced in the pad 2 becomes an H level.

On the other hand, when the read data DQ0Z is an L level, the output of the inverter 7 becomes an H level, the output of the NAND circuit 10 becomes an L level, and the output of the NOR circuit 11 becomes an L level.

As a result, the output of the NAND circuit 5 becomes an H level, whereby the pMOS transistor 3 becomes an OFF state, and the output of the NOR circuit 6 becomes an H level, whereby the nMOS transistor 4 becomes an ON state, and, thus, the data DQ0 produced in the pad 2 becomes an L level.

On the other hand, when the high-impedance setting signal HIZ is set to an H level, the pMOS transistor 12 becomes an OFF state, whereby the NAND circuit 10 is deactivated and the nMOS transistor 14 becomes an ON state, and, thus, a level of a node 14A becomes an L level.

At that time, the output of the inverter 9 becomes an L level and the nMOS transistor 13 becomes an OFF state, whereby the NOR circuit 11 is deactivated and the pMOS transistor 15 becomes an ON state, and, thus, the level of a node 15A becomes an H level.

As a result, the output of the NAND circuit 5 becomes an H level, whereby the pMOS transistor 3 becomes an OFF state, and the output of the NOR circuit 6 becomes an L level, whereby the nMOS transistor 4 becomes an OFF state, and, thus, the output state in the pad 2 becomes an high-impedance state.

As mentioned above, according to the conventional semiconductor memory device, the 01Z-test mode may be performed. In the 01Z-test mode, when the read data DQ0Z to DQ3Z are all at the H level in the output circuit 16, the output circuit 16 produces the two outputs at an H level to the output circuit 1, and when the read data DQ0Z to DQ3Z are all at the L level in the output circuit 16, the output circuit 16 produces the two outputs at an L level to the output circuit 1.

In the output circuit 1, one of the read data DQ0Z provided into the output circuit 1 and logic data indicated by the two outputs from the output circuit 16 is selected and produced to the pad 2 based on the 01Z-test-mode setting signal TESTZ. In the normal mode, the read data DQ0Z is selected, and in the 01Z-test mode the logic data determined in the output circuit 16 is selected regardless of the read data DQ0Z.

Therefore, for the above-discussed selection, in the output circuit 1, the NAND circuits 10, 5 and the NOR circuits 11, 6 need to be provided. In practical use, the NAND circuits 10, 5 and the NOR circuits 11, 6 are connected in a main output path having a pair of paths between the input port 1A and the pMOS transistor 3 and between the input port and the nMOS transistor 4.

Accordingly, even in the normal mode, the data DQ0Z provided to the main output path must pass the NAND circuits 10, 5 and the NOR circuits 11, 6.

In this situation, since these NAND circuits 10, 5 and NOR circuits 11, 6 may generate a large delay, there is thus a problem in that it takes a long time to output the data which is read from the memory cell portion in the normal mode.

SUMMARY OF THE INVENTION

It is an object of the present invention to provide a semiconductor memory device which may perform a 01Z-test mode and reduce the time necessary for outputting data in the normal mode, in which the disadvantages described above are eliminated.

The object described above is achieved by a semiconductor memory device comprising: a memory cell portion; and at least one output part being provided with a plurality of read data which are read from the memory cell portion and a mode selection signal, the output part including; a logic decision circuit for producing a control signal indicating whether logic levels of the plurality of read data are all the same; an output circuit controlling to operate in at least one of two states, a first state being to transmit first read data of the plurality of read data to an output port of the output circuit and a second state being to set the output port to be at a high-impedance state depending on the control signal and the mode selection signal; wherein when the mode selection signal indicates a normal mode, the output circuit operates in the first state, and when the mode selection signal indicates a test mode, the output circuit operates to in one of the first state and the second state depending on the control signal.

The object described above is also achieved by the semiconductor memory device mentioned above, wherein the control signal from the logic decision circuit has a first level for controlling the output circuit to transmit the first read data to the output port of the output circuit when logic levels of the plurality of read data are the same, and the control signal has a second level for controlling the output circuit to set the output port to be at the high-impedance state when logic levels of the plurality of read data are different.

The object described above is also achieved by the semiconductor memory device mentioned above, wherein the output circuit comprises at least one inverter which is activated based on the control signal from the logic decision circuit, the inverter being activated for transmitting the first read data to the output port.

According to the above-mentioned semiconductor memory device, an output of the logic decision circuit is the control signal indicating whether the plurality of read data are all the same or not. In the prior-art device shown in FIG. 2, the output of the output circuit 16 indicates whether the plurality of read data are all high, all low, or neither. In the present invention, the control signal does not need to indicate that the read data is high or low.

Further, in the output circuit, by the first read data of the plurality of read data being transmitted to the output of the output circuit based on the control signal from the logic decision circuit, whether the read data are all high or all low may be detected.

Accordingly, the output circuit does not need logic circuits such as a NAND circuit and a NOR circuit which are used for logical processing with the output from the output circuit 16 in the prior-art semiconductor memory device.

Therefore, since the NAND circuits and the NOR circuits having relatively large delay may be removed from a transmission path for the first read data in the output circuit, when the semiconductor memory device according to the present invention operates in the normal mode, the first read data may be externally derived from the output circuit with high speed.

Other objects and further features of the present invention will be apparent from the following detailed description when read in conjunction with the accompanying drawings.

DESCRIPTION OF THE PREFERRED EMBODIMENTS

Figure 3:
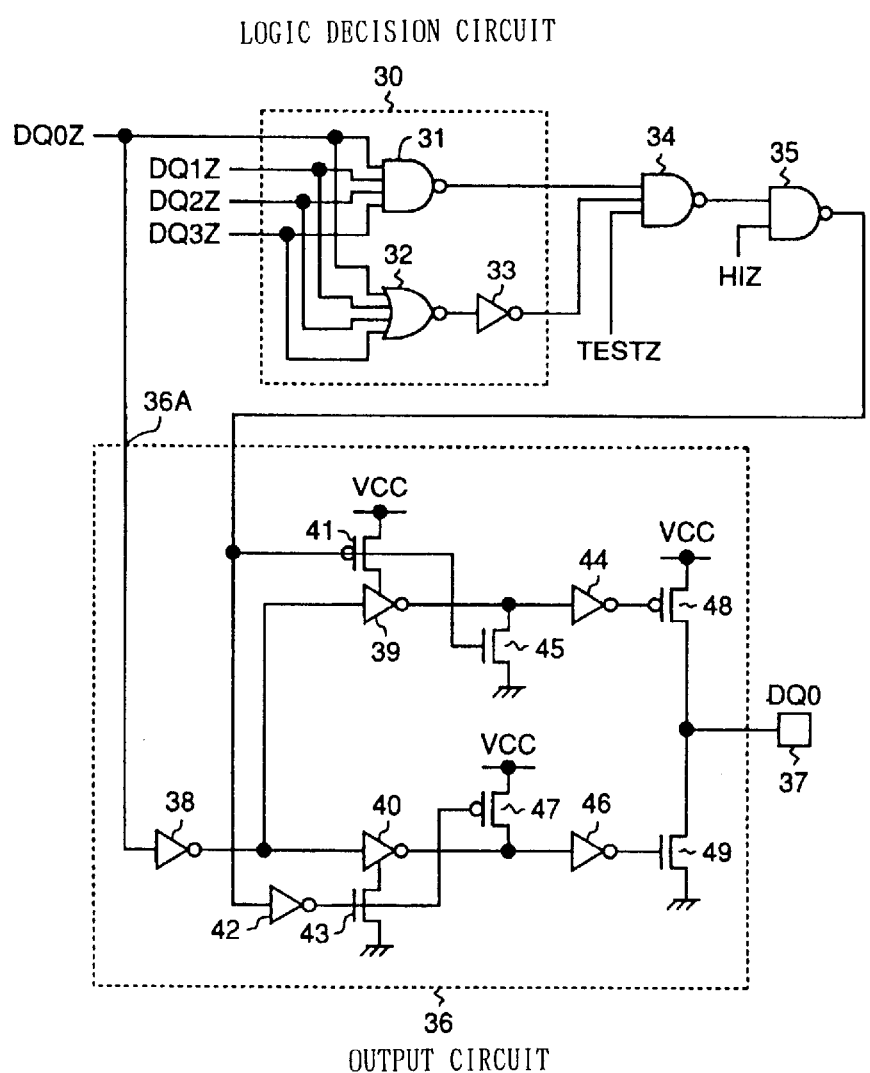
FIG. 3 shows a schematic diagram of an output part of the semiconductor memory device according to the present invention.

First, a description will be given of a first embodiment of a semiconductor memory device according to the present invention. FIG. 3 shows a schematic diagram of an output part of the semiconductor memory device according to the present invention. The output part shown in FIG. 3 includes a logic decision circuit 30 and an output circuit 36. Read data DQ0Z to DQ3Z are read in parallel from a memory cell portion (not shown) of the semiconductor memory device, and are provided to the logic decision circuit 30 which decides whether the read data DQ0Z to DQ3Z are identical to each other.

The logic decision circuit 30 includes a NAND circuit 31 for NAND processing the read data DQ0Z to DQ3Z, a NOR circuit 32 for NOR processing the read data DQ0Z to DQ3Z, and an inverter 33 for inverting an output of the NOR circuit 32.

In the logic decision circuit 30, a NAND circuit 34 NAND processes an output of the NAND circuit 31, an output of the inverter 33, and a 01Z-test-mode setting signal TESTZ. The 01Z-test-mode setting signal TESTZ is set to an H level for the 01Z-test mode, and is set to an L level for the normal mode.

A NAND circuit 35 NAND processes an output of the NAND circuit 34 and a high-impedance setting signal HIZ. The high-impedance setting signal is set to an L level when an output of the output circuit 36 is set to a high-impedance state.

In the output part shown in FIG. 3, the output circuit 36 is provided for the read data DQ0Z to perform the normal mode and the 01Z-test mode. The output circuit 36 has a pad 37 of a data input-and-output port.

In the output circuit 36, an inverter 38 inverts the read data DQ0Z, and inverters 39 and 40 respectively invert an output of the inverter 38.

A pMOS transistor 41 (in the specification, a pMOS transistor and an nMOS transistor indicate filed-effect transistors (FETs)) is connected between a VCC power-supply line for supplying a power-supply voltage VCC and a power-supply port of the inverter 39, and is controlled to be ON and OFF by an output of the NAND circuit 35.

An inverter 42 inverts the output of the NAND circuit 35, and an nMOS transistor 43 is connected between a ground port of the inverter 40 and a ground line, and is controlled to be ON and OFF by an output of the inverter 42.

An input port of an inverter 44 is connected to an output port of the inverter 39, and an nMOS transistor 45 is connected between the input port of the inverter 44 and the ground line, and is controlled to be ON and OFF by the output of the NAND circuit 35.

An input port of an inverter 46 is connected to an output port of the inverter 40, and a pMOS transistor 47 is connected between the VCC power-supply line and the input port of the inverter 46, and is controlled to be ON and OFF by the output of the inverter 42.

A pMOS transistor 48 is an output transistor for a pull-up operation, a source of the pMOS transistor 48 is connected to the VCC power-supply line, a drain thereof is connected to the pad 37, and a gate thereof is connected to an output port of the inverter 44.

An nMOS transistor 49 is an output transistor for a pull-down operation, a source of the pMOS transistor 49 is connected to the ground line, a drain thereof is connected to the pad 37, and a gate thereof is connected to an output port of the inverter 46.

Figure 4:
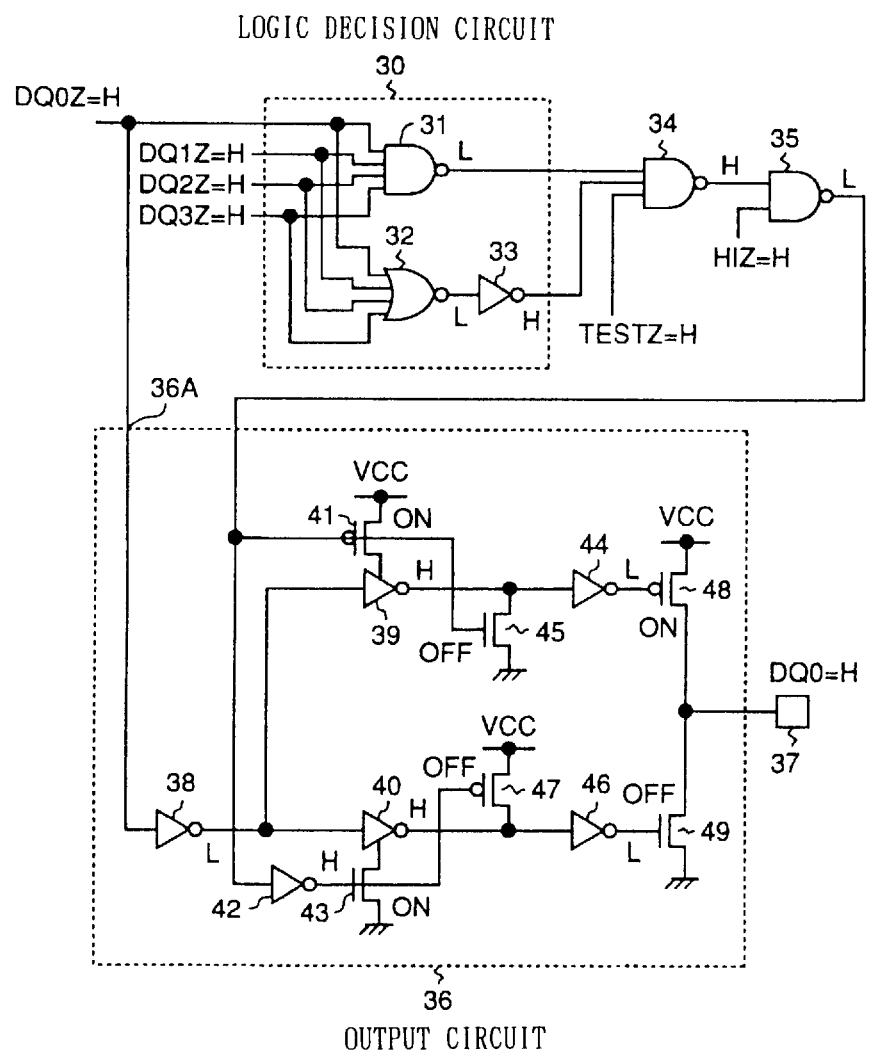
FIG. 4 shows a schematic diagram of the output part for explaining an operation in a 01Z-test mode when read data DQ0Z to DQ3Z are all H level.
Figure 5:
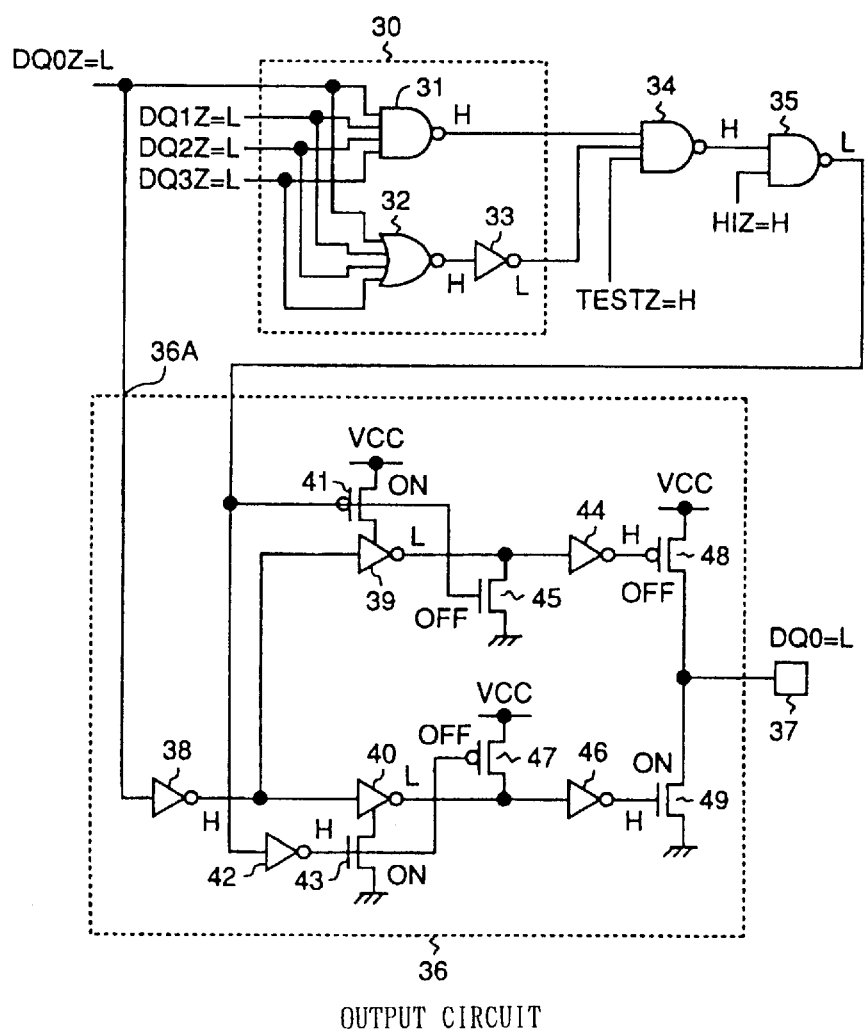
FIG. 5 shows a schematic diagram of the output part for explaining the operation in the 01Z-test mode when the read data DQ0Z to DQ3Z are all L level.
Figure 6:
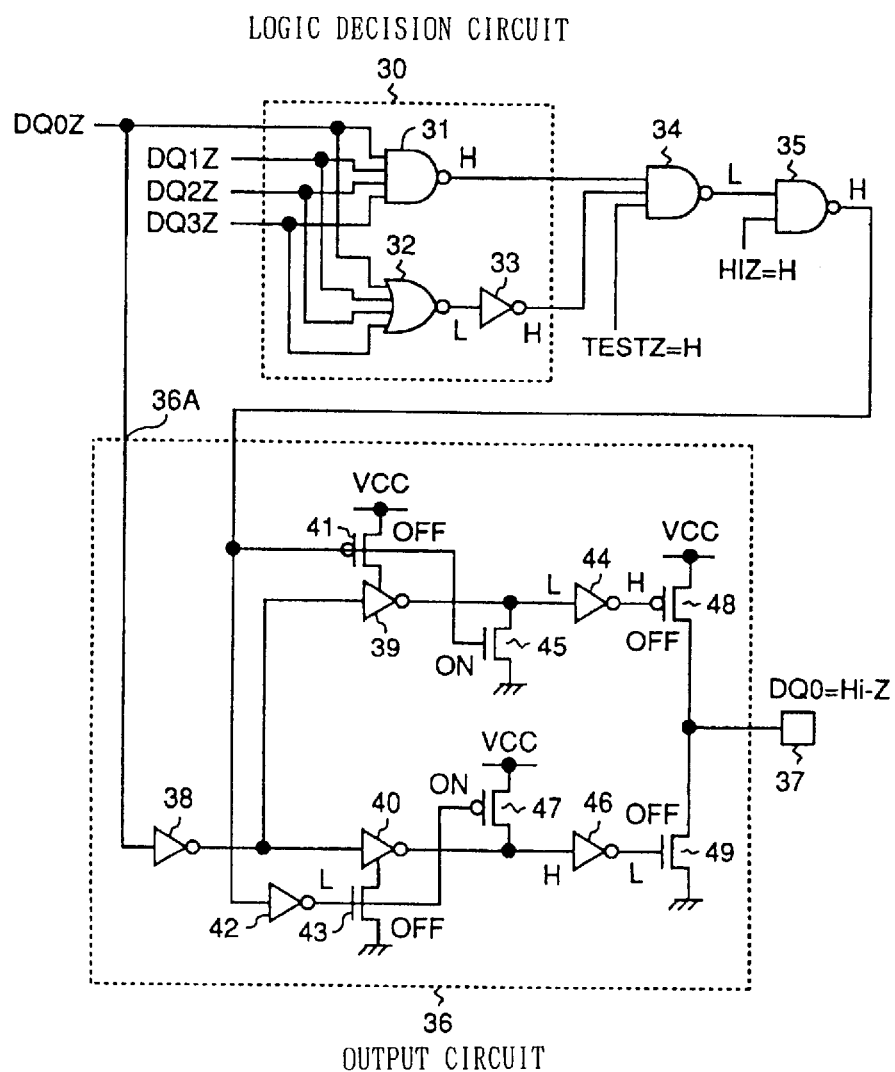
FIG. 6 shows a schematic diagram of the output part for explaining the operation in the 01Z-test mode when the read data DQ0Z to DQ3Z are neither all H level or all L level.

Next, a description will be given of an operation in the 01Z-test mode for the output part of the semiconductor memory device shown in FIG. 3, by referring to FIG. 4 to FIG. 6. FIG. 4 shows a schematic diagram of the output part for explaining the operation in the 01Z-test mode when the read data DQ0Z to DQ3Z are all H level. FIG. 5 shows a schematic diagram of the output part for explaining the operation in the 01Z-test mode when the read data DQ0Z to DQ3Z are all L level. FIG. 6 shows a schematic diagram of the output part for explaining the operation in the 01Z-test mode when the read data DQ0Z to DQ3Z are neither all H level or all L level.

In the 01Z-test mode, the 01Z-test-mode setting signal TESTZ is set to an H level, and the high-impedance setting signal HIZ is set to an H level.

In the 01Z-test mode, as shown in FIG. 4, when the read data DQ0Z to DQ3Z are all H level, the output of the NAND circuit 31 becomes an L level, the output of the NOR circuit 32 becomes an L level, the output of the inverter 33 becomes an H level, the output of the NAND circuit 34 becomes an H level, and the output of the NAND circuit 35 becomes an L level.

As a result, the pMOS transistor 41 becomes an ON state, whereby the inverter 39 is activated and the nMOS transistor 45 becomes an OFF state.

At that time, the output of the inverter 42 becomes an H level, the nMOS transistor 43 becomes an ON state, whereby the inverter 40 is activated and the pMOS transistor 47 becomes an OFF state.

Further, in this case, the output of the inverter 38 becomes an L level, the output of the inverter 39 becomes an H level, the output of the inverter 44 becomes an L level, the pMOS transistor 48 switches to an ON state, the output of the inverter 40 becomes an H level, the output of the inverter 46 becomes an L level, and the nMOS transistor 49 switches to an OFF state.

As a result, the data DQ0 produced in the pad 37 becomes the same H level as the read data DQ0Z.

On the other hand, as shown in FIG. 5, when the read data DQ0Z to DQ3Z are all L level, the output of the NAND circuit 31 becomes an H level, the output of the NOR circuit 32 becomes an H level, the output of the inverter 33 becomes an L level, the output of the NAND circuit 34 becomes an H level, and the output of the NAND circuit 35 becomes an L level.

As a result, pMOS transistor 41 switches to an ON state, whereby the inverter 39 is activated and the nMOS transistor 45 switches to an OFF state.

At that time, the output of the inverter 42 becomes an H level, the nMOS transistor 43 switches to an ON state, whereby the inverter 40 is activated and the pMOS transistor 47 switches to an OFF state.

Further, in this case, the output of the inverter 38 becomes an H level, the output of the inverter 39 becomes an L level, the output of the inverter 44 becomes an H level, the pMOS transistor 48 switches to an OFF state, the output of the inverter 40 becomes an L level, the output of the inverter 46 becomes an H level, and the nMOS transistor 49 switches to an ON state.

As a result, the data DQ0 produced in the pad 37 becomes the same L level as the read data DQ0Z.

Further, as shown in FIG. 6, when the read data DQ0Z to DQ3Z are neither all H level or all L level, the output of the NAND circuit 31 becomes an H level, the output of the NOR circuit 32 becomes an L level, the output of the inverter 33 becomes an H level, the output of the NAND circuit 34 becomes an L level, and the output of the NAND circuit 35 becomes an H level.

As a result, pMOS transistor 41 switches to an OFF state, whereby the inverter 39 is deactivated and the nMOS transistor 45 switches to an ON state.

At that time, the output of the inverter 42 becomes an L level, the nMOS transistor 43 switches to an OFF state, whereby the inverter 40 is deactivated and the pMOS transistor 47 switches to an ON state.

Further, in this case, the input of the inverter 44 is set to an L level, the output of the inverter 44 becomes an H level, the pMOS transistor 48 switches to an OFF state, the input of the inverter 46 is set to an H level, the output of the inverter 46 becomes an L level, and the nMOS transistor 49 switches to an OFF state.

As a result, an output state of the pad 37 becomes a high-impedance state (Hi–Z).

Figure 7:
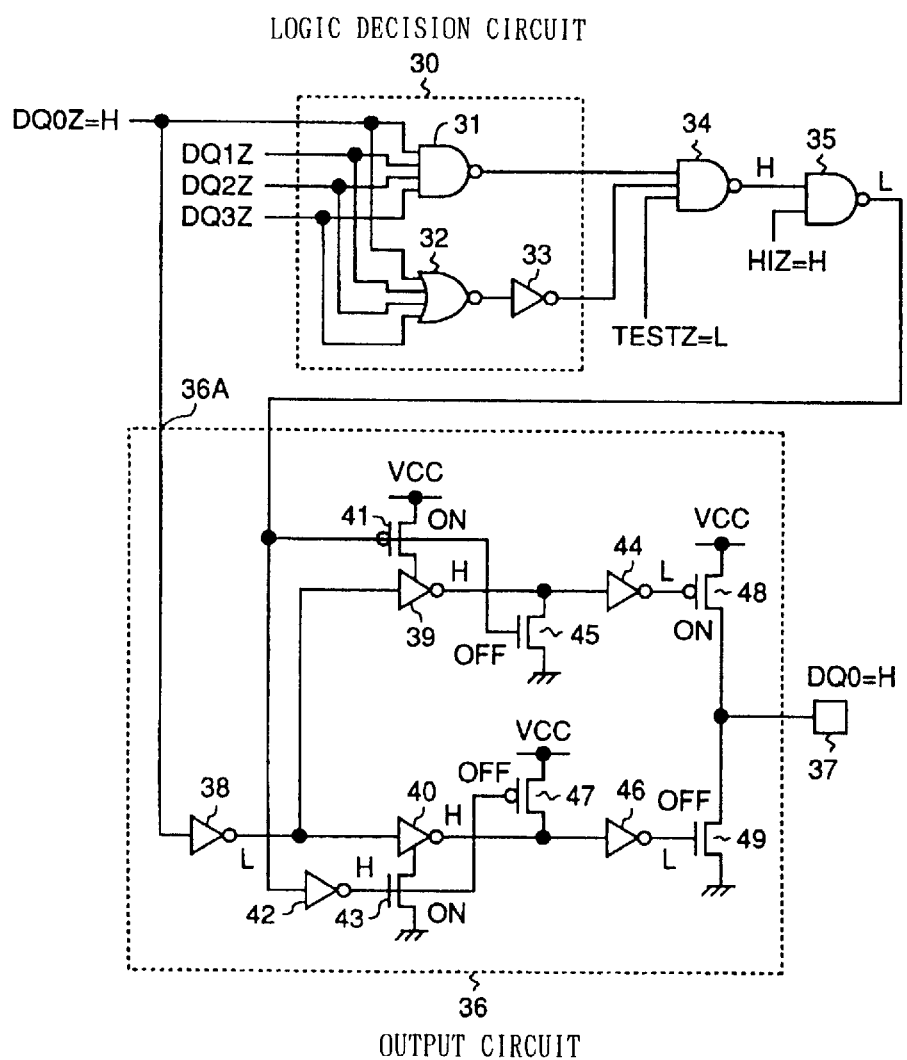
FIG. 7 shows a schematic diagram of the output part for explaining an operation in the normal mode when a high-impedance setting signal HIZ is an H level and the read data DQ0Z is an H level.
Figure 8:
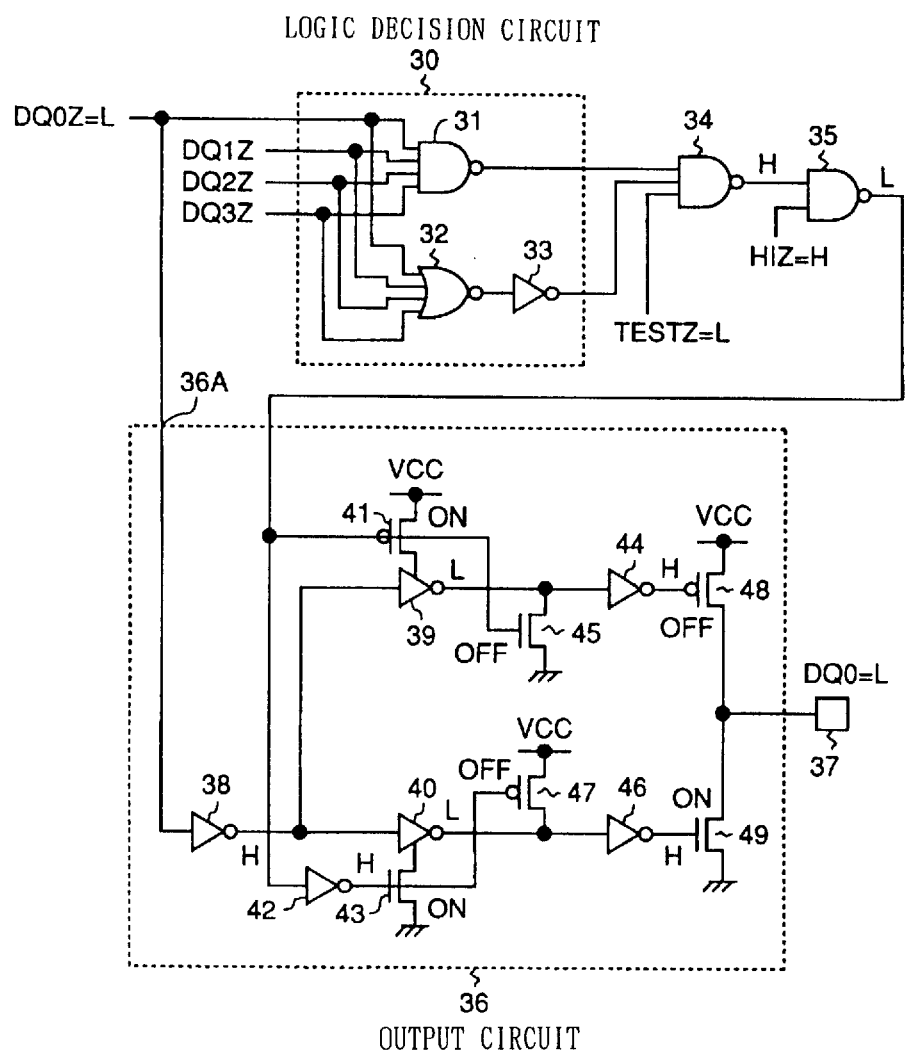
FIG. 8 shows a schematic diagram of the output part for explaining the operation in the normal mode when the high-impedance setting signal HIZ is an H level and the read data DQ0Z is an L level.
Figure 9:
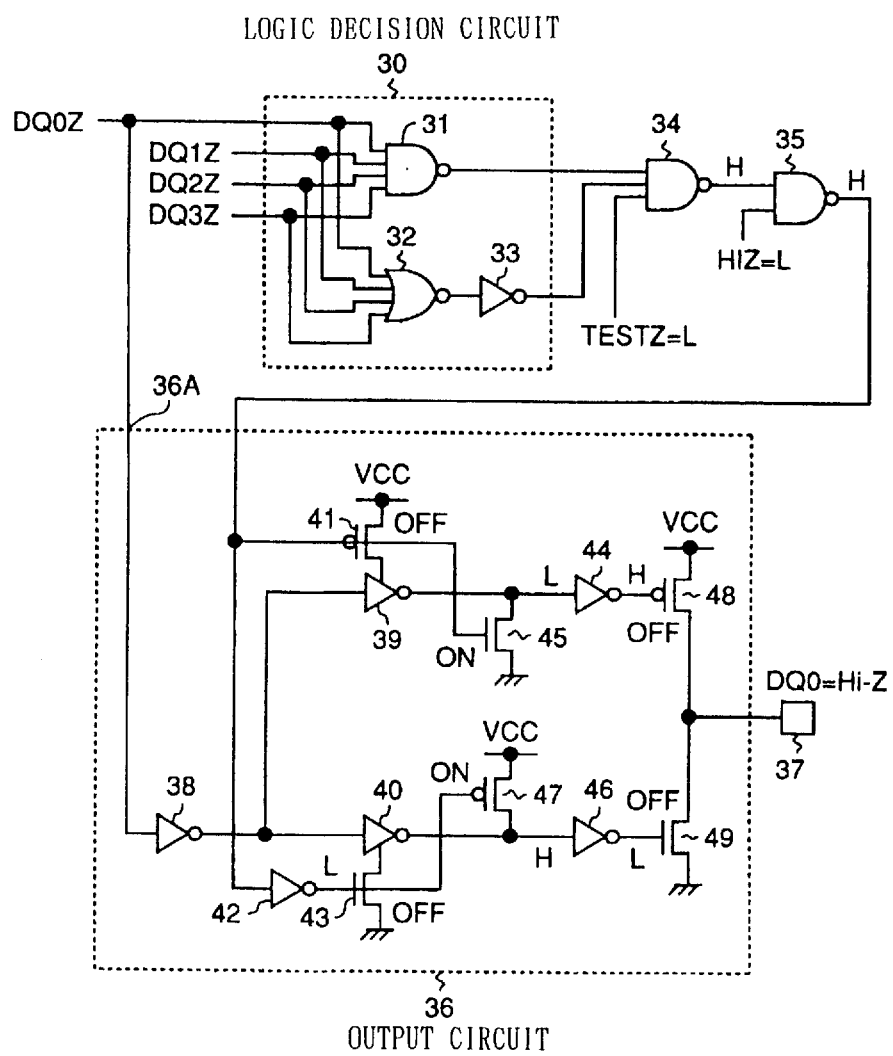
FIG. 9 shows a schematic diagram of the output part for explaining the operation in the normal mode when the high-impedance setting signal HIZ is an L level.

Next, a description will be given of an operation in the normal mode for the output part of the semiconductor memory device shown in FIG. 3, by referring to FIG. 7 to FIG. 9. FIG. 7 shows a schematic diagram of the output part for explaining the operation in the normal mode when the high-impedance setting signal HIZ is an H level and the read data DQ0Z is an H level. FIG. 8 shows a schematic diagram of the output part for explaining the operation in the normal mode when the high-impedance setting signal HIZ is an H level and the read data DQ0Z is an L level. FIG. 9 shows a schematic diagram of the output part for explaining the operation in the normal mode when the high-impedance setting signal HIZ is an L level.

In the normal mode, the 01Z-test-mode setting signal TESTZ is set to an L level, whereby the output of the NAND circuit 34 becomes an H level regardless of the outputs of the NAND circuit 31 and the inverter 33.

In the normal mode, as shown in FIG. 7, when the high-impedance setting signal HIZ is set to an H level, the output of the NAND circuit 35 becomes an L level.

As a result, the pMOS transistor 41 switches to an ON state, whereby the inverter 39 is activated and the nMOS transistor 45 switches to an OFF state.

At that time, the output of the inverter 42 becomes an H level, the nMOS transistor 43 switches to an ON state, whereby the inverter 40 is activated and the pMOS transistor 47 switches to an OFF state.

In this case, when the read data DQ0Z is an H level, as shown in FIG. 7, the output of the inverter 38 becomes an L level, the output of the inverter 39 becomes an H level, the output of the inverter 44 becomes an L level, the pMOS transistor 48 switches to an ON state, the output of the inverter 40 becomes an H level, the output of the inverter 46 becomes an L level, and the nMOS transistor 49 switches to an OFF state.

As a result, the data DQ0 produced in the pad 37 becomes the same H level as the read data DQ0Z.

On the other hand, as shown in FIG. 8, when the high-impedance setting signal HIZ is set to an H level and when the read data DQ0Z is an L level, the output of the inverter 38 becomes an H level.

In this case, the output of the inverter 39 becomes an L level, the output of the inverter 44 becomes an H level, the pMOS transistor 48 switches to an OFF state, the output of the inverter 40 becomes an L level, the output of the inverter 46 becomes an H level, and the nMOS transistor 49 switches to an ON state.

As a result, the data DQ0 produced in the pad 37 becomes the same L level as the read data DQ0Z.

Further, as shown in FIG. 9, when the high-impedance setting signal HIZ is set to an L level, the output of the NAND circuit 35 becomes an H level regardless of the output of the NAND circuit 34.

In this case, the pMOS transistor 48 switches to an OFF state, whereby the inverter 39 is deactivated and the nMOS transistor 45 switches to an ON state.

At that time, the output of the inverter 42 becomes an L level, the nMOS transistor 43 switches to an OFF state, whereby the inverter 40 is deactivated and the pMOS transistor 47 switches to an ON sate.

Further, the input of the inverter 44 is set to an L level, whereby the output of the inverter 44 becomes an H level and the pMOS transistor 48 switches to an OFF state. The input of the inverter 46 is set to an H level, whereby the output of the inverter 46 becomes an L level and the nMOS transistor 49 switches to an OFF state.

As a result, in this case, the output state of the pad 37 becomes a high-impedance state (Hi–Z).

As described above, in the semiconductor memory device according to the present invention, both the 01Z-test mode and the normal mode may be performed.

In the following, these mode operations are summarized. To simplify the description, it is assumed that the high-impedance setting signal HIZ is always at an H level. In the output part of this device, in the logic decision circuit 30, the 4-bit read data DQ0Z to DQ3Z are compressed, and the compressed data is further combined with the 01Z-test-mode setting signal TESTZ to produce a single control signal (the output of the NAND circuit 35) for controlling the output circuit 36.

In the 01Z-test mode, the control signal indicates whether the read data DQ0Z to DQ3Z are all the same or not. In this mode, when the read data DQ0Z to DQ3Z are all the same, the control signal is at an L level which controls the output circuit 36 to be a through state in which the same level as the data DQ0Z is produced to the pad 2. When the read data DQ0Z to DQ3Z are not all the same, the control signal is at an H level which controls the output circuit 36 to be an open state in which the pad 2 is at the high-impedance state.

On the other hand, in the normal mode, the control signal from the NAND circuit 35 is also set to be at an L level which controls the output circuit 36 to be in the through state mentioned above.

Figure 1:
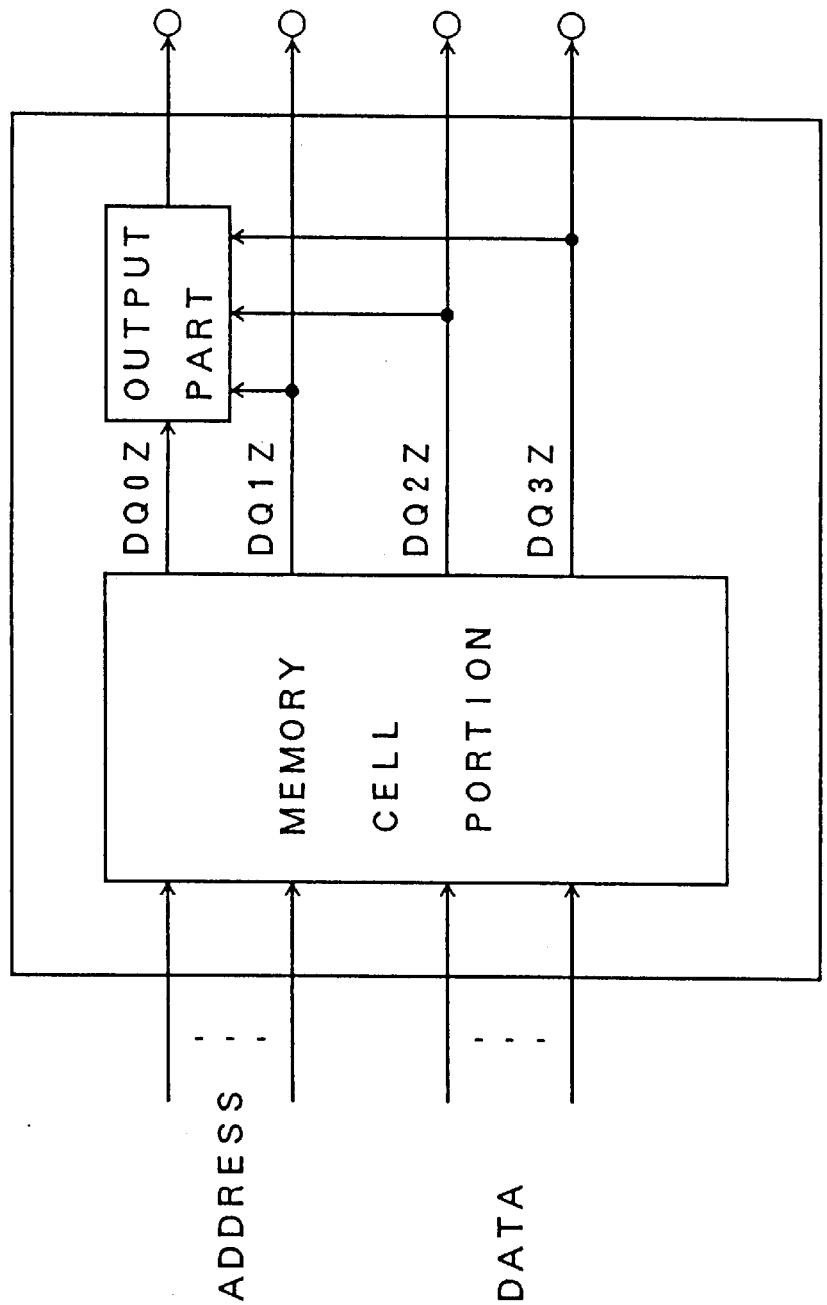
FIG. 1 shows a block diagram of a conventional semiconductor memory device having a data-compression test mode.
Figure 2:
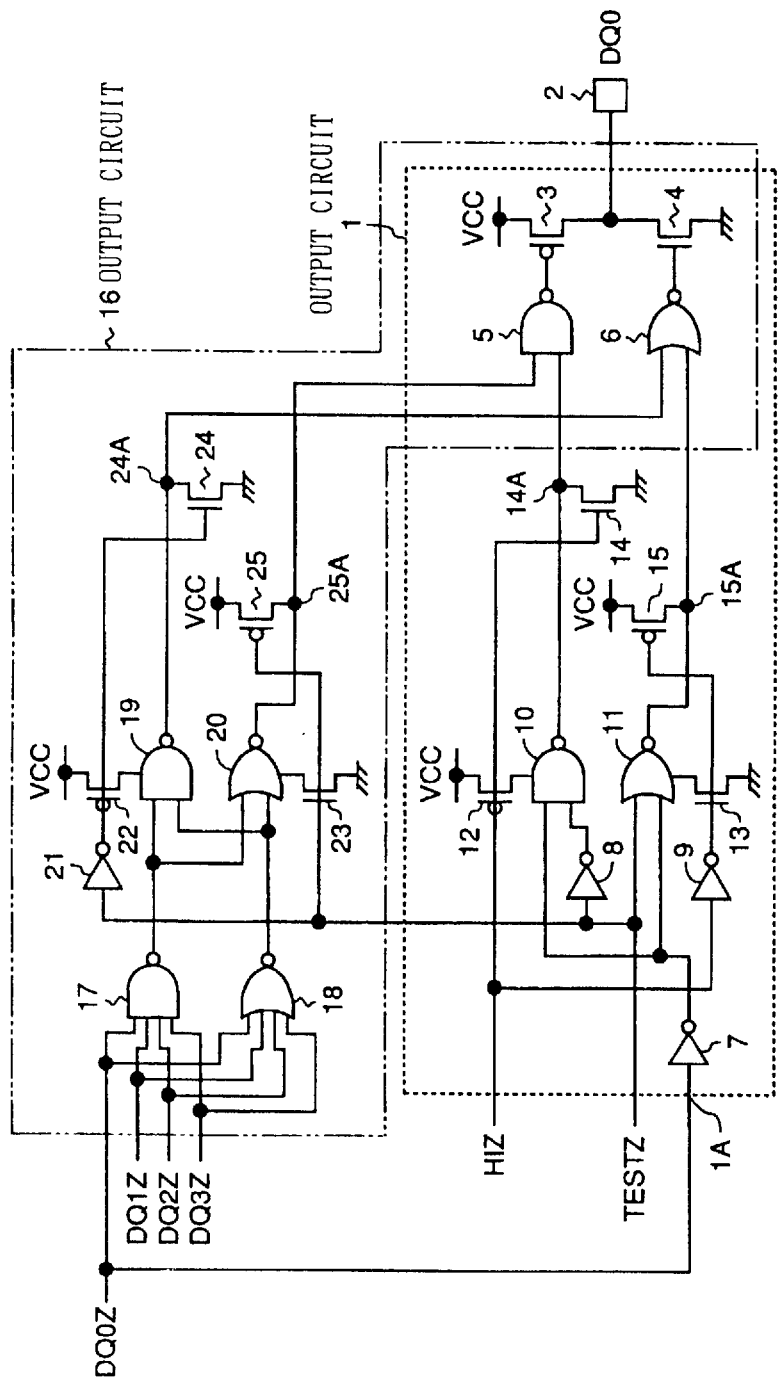
FIG. 2 shows a schematic diagram of a prior-art output part of the conventional semiconductor memory device shown in FIG. 1.

Namely, in the output part of the semiconductor memory device according to the present invention, the output signal of the logic decision circuit 30 through the NAND circuits 34, 35 indicates the control signal for controlling the output circuit 36 to be in the through state or the open state. In the prior-art semiconductor memory device shown in FIG. 2, the outputs of the output circuit 16 indicate logic data which is to be selected in the output circuit 1 in the 01Z-test mode.

Further, in both cases where the read data DQ0Z to DQ3Z are all the same in the 01Z-test mode and where the mode is in the normal mode, the output circuit 36 operates in the same way (the through state).

To set the output circuit 36 to be in the through state, the control signal from the logic decision circuit 30 may control transistor switches connected to a main output path for the read data DQ0Z. Since logic selection is unnecessary in this device, the NAND circuits and the NOR circuits does not need to be provided in the main output path having a pair of paths between the input port 36A and the gate of the pMOS transistor 48 for the output transistor and between the input port 36A and the gate of the nMOS transistor 49. In this device, the only inverters 38–40, 44 and 46 are provided in the main output path, and delay time of these inverters is less than that in the NAND circuits and NOR circuits.

Accordingly, when the semiconductor memory device according to the present invention operates in the normal mode, the read data produced from the memory cell portion may be externally derived with high speed.

In the above descriptions, the descriptions have been given with referring to one embodiment in that the 4-bit read data DQ0Z to DQ3Z which have been read from the memory cell portion (cell array part) are compressed into 1-bit data. The present invention is not limited to the above-mentioned embodiment.

The present invention may also be applied to another embodiment in that read data having a plurality of bits (for example, 2, 8, 16) is compressed into the 1-bit data for the test.

Further, in the present invention, a number of bits of the read data produced in parallel from the memory cell portion does not need to identical to a number of bits of the inputs of the output part. In this case, the bits of the read data are divided into a plurality of bit groups, and each of bit groups is compressed to the 1-bit data for the test. For example, when 32-bit read data DQ0Z to DQ31Z are produced in parallel from the memory cell portion, the read data DQ0Z to DQ31Z are divided into 4 bit groups of the read data DQ0Z to DQ7Z, the read data DQ8Z to DQ15Z, the read data DQ16Z to DQ23Z, and the read data DQ24Z to DQ31Z, and each bit group having 8 bits may be compressed into 1-bit data for the test.

Further, the present invention is not limited to these embodiments, but other variations and modifications may be made without departing from the scope of the present invention.

What is claimed is:

1. A semiconductor memory device comprising:
   a memory cell portion; and
   at least one output part being provided with a plurality of read data which are read from said memory cell portion and a mode selection signal, said output part including
   a logic decision circuit for producing a control signal indicating whether logic levels of said plurality of read data are all the same, and
   an output circuit which includes a transmission path having transistors and having logic gates all of which have only a single input terminal, and said output circuit controls to operate in at least one of two states, a first state being to transmit first read data to an output port of said output circuit through said transmission path and a second state being to set said output port to be at a high-impedance state depending on said control signal and said mode selection signal;
   wherein when the mode selection signal indicates a normal mode, said output circuit operates in said first state, and when the mode selection signal indicates a test mode, said output circuit operates to be in one of said first state and said second state depending on said control signal.

2. The semiconductor memory device as claimed in claim 1, wherein said control signal from said logic decision circuit has a first level for controlling said output circuit to transmit said first read data to the output port of said output circuit when logic levels of said plurality of read data are the same, and said control signal has a second level for controlling said output circuit to set the output port to be at the high-impedance state when logic levels of said plurality of read data are different.

3. The semiconductor memory device as claimed in claim 2, wherein said output circuit comprises at least one inverter which is activated based on said control signal from said logic decision circuit, said inverter being activated for transmitting said first read data to the output port.

4. The semiconductor memory device as claimed in claim 3, wherein said output circuit further comprises:
   a first output FET for a pull-up operation, a source of said first output FET being connected to a first power-supply line supplying a first power-supply voltage, a drain of said first output FET being connected to said output port; and
   a second output FET for a pull-down operation, a drain of said second output FET being connected to said output port, a source of said second output FET being connected to a second power-supply line supplying a second power-supply voltage less than said first power-supply voltage.

5. The semiconductor memory device as claimed in claim 4, wherein said output circuit further comprises:
   a first inverter for inverting said first read data;
   a second inverter, connected to an output of said first inverter, being controlled to be one of activated and deactivated;
   a third inverter connected between an output of said second inverter and a gate of said first output FET, an input of said third inverter being connected to said second power-supply line when said second inverter is deactivated;
   a fourth inverter, connected to said output of said first inverter, being controlled to be one of activated and deactivated; and
   a fifth inverter connected between an output of said fourth inverter and a gate of said second output FET, an input of said fifth inverter being connected to said first power-supply line when said fourth inverter is deactivated.

6. The semiconductor memory device as claimed in claim 5, wherein said output circuit further comprises:
   a third FET, connected between a power-supply port of said second inverter and said first power-supply line, being controlled to be conductive by a first control signal generated based on said control signal from said logic decision circuit;
   a fourth FET, connected between an input port of said third inverter and said second power-supply line, being controlled to be conductive by said first control signal;
   a fifth FET, connected between a power-supply port of said fourth inverter and said second power-supply line, being controlled to be conductive by a second control signal which is an inverted signal of said first control signal; and
   a sixth FET, connected between an input port of said fifth inverter and said first power-supply line, being controlled to be conductive by said second control signal.

7. The semiconductor memory device as claimed in claim 6, wherein said logic decision circuit comprises:
   a first NAND circuit NAND processing said plurality of read data;
   a NOR circuit NOR processing said plurality of read data;
   a sixth inverter inverting an output of said NOR circuit; and
   a second NAND circuit NAND processing an output of said first NAND circuit, an output of said sixth inverter, and said mode selection signal and producing said control signal of said logic decision circuit.

8. A semiconductor memory device comprising:
   a logic decision circuit, receiving a plurality of read data which are read from a memory cell portion and a test mode signal, for producing a control signal having one logic level when logic levels of said plurality of read data are all the same in a test mode;

an output circuit, receiving the control signal, including
an input terminal receiving first read data of said plurality of read data;
an output terminal; and
a data path between the input terminal and the output terminal;
wherein:
said output terminal being at a high-impedance when said control signal is at another logic level;
said output circuit outputting said first read data through said data path when the control signal is at said one logic level; and
said data path of the output circuit having transistors and having logic gates all of which have only a single input terminal, the output circuit receiving the first read data and the control signal as input signals.

* * * * *